(12) United States Patent
Redmond et al.

(10) Patent No.: US 11,543,575 B2
(45) Date of Patent: Jan. 3, 2023

(54) HOLOGRAPHIC DISPLAY APPARATUS ILLUMINATING A HOLOGRAM AND A HOLOGRAPHIC IMAGE

(71) Applicant: Ceres Imaging Limited, St. Andrews (GB)

(72) Inventors: Ian Redmond, St. Andrews (GB); Duncan Anderson, St. Andrews (GB)

(73) Assignee: CERES IMAGING LIMITED, St. Andrews (GB)

( * ) Notice: Subject to any disclaimer, the term of this patent is extended or adjusted under 35 U.S.C. 154(b) by 166 days.

(21) Appl. No.: 16/649,462

(22) PCT Filed: Sep. 21, 2018

(86) PCT No.: PCT/GB2018/052703
§ 371 (c)(1),
(2) Date: Mar. 20, 2020

(87) PCT Pub. No.: WO2019/058137
PCT Pub. Date: Mar. 28, 2019

(65) Prior Publication Data
US 2020/0233134 A1  Jul. 23, 2020

(30) Foreign Application Priority Data

Sep. 22, 2017  (GB) ..................... 1715369

(51) Int. Cl.
*G02B 5/32* (2006.01)
*G02B 19/00* (2006.01)
(Continued)

(52) U.S. Cl.
CPC ........... *G02B 5/32* (2013.01); *G02B 19/0066* (2013.01); *G03H 1/02* (2013.01); *G03H 1/0465* (2013.01);
(Continued)

(58) Field of Classification Search
None
See application file for complete search history.

(56) References Cited

U.S. PATENT DOCUMENTS 6,300,986 B1 * 10/2001 Travis .................... H04N 13/39
349/5
2007/0070476 A1 * 3/2007 Yamada ............... G02B 3/0056
359/9
(Continued)

FOREIGN PATENT DOCUMENTS

CN  201521840 U  7/2010
CN  202182383 U  4/2012
(Continued)

OTHER PUBLICATIONS

Office Action from corresponding Chinese Application No. 2018800068245.4, dated Oct. 19, 2021.
(Continued)

*Primary Examiner* — Jennifer D. Carruth
(74) *Attorney, Agent, or Firm* — Barnes & Thornburg, LLP

(57) ABSTRACT

There is herein defined optics (e.g. an array of optics) forming an optical beam to either produce a collimated or diverging/converging beam emerging from a virtual source point to illuminate a hologram. There is also described an optical beam illuminating a reflection hologram from the front and a further configuration where an optical beam combined with a holographic optical element (HOE) minor enables rear illumination of a reflection hologram.

14 Claims, 18 Drawing Sheets

(51) Int. Cl.
   *G03H 1/02* (2006.01)
   *G03H 1/04* (2006.01)
(52) U.S. Cl.
   CPC .............. *G03H 2001/0212* (2013.01); *G03H 2001/0216* (2013.01); *G03H 2001/0473* (2013.01)

(56) References Cited

U.S. PATENT DOCUMENTS

| | | | |
|---|---|---|---|
| 2011/0063289 A1* | 3/2011 | Gantz | G03H 1/02 |
| | | | 345/419 |
| 2014/0016051 A1 | 1/2014 | Kroll | |
| 2014/0211287 A1 | 7/2014 | Redmond | |
| 2014/0376207 A1 | 12/2014 | Futterer | |
| 2015/0293358 A1* | 10/2015 | de Matos Pereira Vieira | G02B 27/0172 |
| | | | 359/13 |
| 2016/0077338 A1* | 3/2016 | Robbins | G02B 27/0172 |
| | | | 345/8 |
| 2016/0378062 A1* | 12/2016 | Watanabe | G03H 1/2286 |
| | | | 359/9 |
| 2016/0379606 A1* | 12/2016 | Kollin | G06T 3/4038 |
| | | | 345/428 |
| 2018/0290586 A1 | 10/2018 | Muegge | |
| 2018/0356591 A1* | 12/2018 | Karafin | G02B 6/023 |

FOREIGN PATENT DOCUMENTS

| | | |
|---|---|---|
| CN | 103384854 A | 11/2013 |
| CN | 104089212 A | 10/2014 |
| DE | 102015121697 A1 | 6/2017 |
| GB | 2178866 A | 2/1987 |
| JP | 2013536451 A | 9/2013 |
| WO | 2010076571 A1 | 7/2010 |

OTHER PUBLICATIONS

International Search Report for PCT/GB2018/052703, dated Nov. 27, 2018.

Office Action from corresponding Chinese Application No. 2018800068245.4, dated Apr. 18, 2022.

Office Action from corresponding Chinese Application No. 2018300063245.4, dated Sep. 19, 2022.

* cited by examiner

HOLOGRAPHIC DISPLAY APPARATUS ILLUMINATING A HOLOGRAM AND A HOLOGRAPHIC IMAGE

CROSS-REFERENCE TO RELATED APPLICATIONS

This application is a National Stage application of International Application No. PCT/GB2018/052703 filed Sep. 21, 2018. This application also claims priority under 35 U.S.C. § 119 to Great Britain Patent Application No. 1715369.3, filed Sep. 22, 2017.

FIELD OF THE INVENTION

The present invention relates to an illumination system comprised of a compact array of light sources and optics forming a larger optical beam to either produce a collimated, diverging or converging beam to illuminate a hologram. In particular, the present invention relates to a first configuration of an optical beam illuminating a hologram from the front and in a second configuration an optical beam combined with a holographical optical element (HOE) mirror to enable rear illumination of a reflection hologram.

BACKGROUND OF THE INVENTION

There exists a need in the art to provide a compact and self-contained method for lighting a display hologram uniformly which can produce high quality images. Most commonly, hologram illumination systems employ a spot-lamp in front and above the hologram, which must be placed at a relatively large distance comparable or greater than the size of the hologram itself, and is therefore bulky, unweildy and impractical in many applications. In addition, such a lamp's illumination is generally not uniform, being stronger in the centre of its distribution. Many applications would benefit from a compact illumination system integrated closely with the hologram itself. Examples would include display holograms to be mounted on a wall like a common painting or photograph without apparent additional separate lighting, and automotive brake or tail lights, where there is not space for external lighting.

Ideally such a compact illumination system is also insensitive to stray light, particularly other typical light sources (such as ceiling spot lamps) or any other lighting sources used for ambient illumination which emit near the direction of the main light source used to illuminate the hologram, and which result in unwanted secondary images.

Although there have been previous ways of illuminating holograms all of these have particular difficulties. For example, U.S. Pat. No. 6,366,371 B1 which relates to use of a reflection hologram in transmission geometry has poor efficiency and stray light control.

Relevant background patents are Dausmann DE 10 2007 022 247 A1 and Ceres U.S. Ser. No. 14/253,733, which are incorporated herein by reference.

It is therefore an object of at least one aspect of the present invention to obviate or mitigate at least one or more of the aforementioned problems.

It is a further object of the present invention to provide an improved apparatus and method for forming an optical beam to either produce a collimated, diverging or converging beam to illuminate a hologram.

It is a yet further object of at least one aspect of the present invention to provide improved holographic displays as a general graphic medium, suitable for advertising, technical and medical visualisation, industrial and consumer applications (e.g. posters, 3D photographs, automotive lighting etc.)

SUMMARY OF INVENTION

According to an aspect of the present invention there is provided a compact holographic display apparatus comprising an array of light sources and optics forming a larger optical beam which may be collimated, diverging or converging, to illuminate a hologram. Each light source may have a corresponding optic which is configured to nominally collimate the light from the light source.

The aggregate beam from the array of sources and optics can be configured to produce a collimated, divergent or convergent overall beam by means of adjusting the offsets of individual optics relative to the light sources.

According to a further aspect of the present invention there is provided a beam illuminating a reflection hologram from the same side as a viewer, i.e. a person viewing the hologram.

According to a further aspect of the present invention there is provided a beam combined with a holographical optical element (HOE) mirror to enable rear (i.e. opposite side to a viewer) illumination of a reflection hologram.

According to a further aspect of the present invention there is provided an illumination unit capable of emitting light to illuminate a hologram and form a consequent holographic image, wherein the illumination unit is comprised of an array of individual light sources and a corresponding array of optics forming an overall collimated, diverging or converging beam.

According to a further aspect of the present invention there is provided a holographic display apparatus comprising:

an illumination unit capable of emitting light to illuminate a hologram and form a consequent holographic image, wherein the illumination unit is comprised of an array of individual light sources and optics forming an overall collimated, diverging or converging beam.

The holographic display apparatus may additionally comprise:

at least one mirror capable of reflecting light from the light source;

wherein reflected light from the mirror is capable of forming a holographic image from the hologram surface.

According to a further aspect of the present invention there is provided a holographic display apparatus comprising:

an illumination unit capable of emitting light to illuminate a hologram and form a consequent holographic image, wherein the illumination unit is comprised of an array of individual light sources and optics forming collimated, diverging or converging illumination;

at least one mirror capable of reflecting light from the light source;

a hologram surface;

wherein reflected light from the mirror is capable of forming a holographic image from the hologram surface.

Generally speaking, the present invention resides in the provision of a compact illumination unit providing an optical beam intended for replaying a holographic image.

In the present invention a standard point or collimated light source is replaced with an array of smaller light source units to create an illumination unit performing the same function. The array achieves a similar source brightness as the standard illumination unit but in a much more compact form.

It has been found that by providing a more compact illumination unit provides the technical advantage of the array allowing the creation of a low-profile optic that industrial designers can then use to minimise the size of their holographic illumination systems.

The illumination unit may therefore comprise an array of small optical units arranged immediately next to one edge of a hologram. The illumination unit may therefore form collimated light and form a large area collimated reference beam.

The illumination unit of the present invention may therefore be compact and smaller than systems used in the prior art. The dimensions of the illumination unit of the present invention may be as shown in FIGS. 5a and 5b. The size of conventional light source may be described as $DxFL_L$ and the size of an array version according to the present invention may be described as $DxFL_A$. In the present invention $FL_A$ is much smaller than $FL_L$ and in a ratio $FL_A:FL_L$ is less than about 0.5:1; less than about 0.25:1; less than about 0.5:1; less than about 0.1:1.

The compact collimated illumination unit may comprise a plurality or an array of light sources formed from lasers and/or LEDs.

The holographic display apparatus may also comprise a substrate (e.g. a glass substrate), a hologram attached to the substrate, and an image.

The array of optical light sources (i.e. optical light units) may be located at any edge of an appropriately configured hologram and substrate.

In the holographic display apparatus and facing the array of light sources there are optical elements which are used to form the illumination beam. The optical elements may be in the form of a convex lens. In alternative embodiments, the elements may be curved mirrors or diffractive optics, either transmissive or reflective.

The illumination unit may be arranged to form a diverging or converging beam to represent the reference beam used in the recording of an original hologram.

Furthermore, the illumination unit may be kept of a small size by the close packing of the light units which can be achieved by using lens elements formed into, for example, rectangular, hexagonal or some other suitable tessellating shape.

The holographic display apparatus of the present invention may be used where the light source for a reflection hologram includes a separate reflecting HOE or angle selective mirror (e.g. WO 2010/076571, which is incorporated herein by reference). There may also be a substrate (e.g. a glass substrate), a hologram and a formed illuminated image.

The present invention also relates to multi-colour illumination using a collimation array. In this embodiment, the individual light sources may be used to emit different colours of light such as from separate coloured LEDs in one package. Each LED package illuminates a single optics (lens, mirror, etc.). Since the LEDs are spatially separated, each colour exits the optic with a different angle. Dichroic mirrors (or HOE mirrors) may be used to ensure that the multi-wavelengths are collinear by selectively adjusting the angle of reflection of the separate colours. An array of light sources may therefore emit coloured light which may be controlled and exit onto dichroic mirrors or HOEs. The light may then be reflected to illuminate a hologram, creating a multi-coloured image.

The present invention also relates to embodiments where a display apparatus may comprise an array of catadioptric collimating elements. The catadioptric elements may comprise a combination of surfaces for refracting, reflecting and total internal reflection (TIR) of the light from a light source. Therefore, the catadioptric elements may form a beam of light using a combination of refractive, reflective and TIR surfaces. The resulting beam of light from the array may be used to illuminate holograms as previously described.

The present invention also relates to display apparatus comprising a collimating element in the form of a parabolic mirror or generic reflector profile to form a collimated beam according to a further embodiment of the present invention. In these embodiments there may be a light source (e.g. an LED or laser) emitting light onto a parabolic mirror comprising optionally a mirror coating. A collimated reference beam of light may be formed which may be used in holographic applications. There may be an array of parabolic mirrors with each parabolic mirror optionally having a light source (e.g. an LED or laser) located at its focal centre. Typically, each parabolic mirror may comprise a mirror coating and may form a collimated light beam that can be used in holographic applications.

In alternative embodiments, the display apparatus may comprise an array of optics to create a beam diverging from a virtual point source. Typically, there may be an array of optics which each comprise an offset light source (e.g. an LED) to create a beam diverging from a virtual point source. The hologram may be illuminated by the display apparatus. In some instances, the reference beam to illuminate the hologram may not require a collimated beam, but rather a diverging or converging beam. An optic array of elements may be configured to create a beam that appears to be diverging from a virtual source point.

The position of each light source (e.g. LED) may be shifted off centre with respect to its local optic axis. An array of refractive optical elements or similar beam shapes may be achieved with the other types of optical elements discussed in the present application.

The present invention therefore relates to display holograms which have a widely acceptable imaging media that may be suitable for advertising or artistic displays. Alternatively, the formed holograms may be used for any other commercial purpose for which a fee may be received.

The holograms of the present invention may be transmission or reflection holograms.

Generally speaking, the present invention resides in the provision of display holograms (i.e. holographs) which may be substantially self-contained, provide viable illumination and are optionally substantially insensitive to stray light.

Electrical powers of the light sources may in the range of about 10-500 W in total.

The light sources may be any appropriate or suitable light source and may, for example, a laser or LED, or any combination thereof, including multiples of each, such as red, green and blue lasers or LEDs, or more than 3 colours.

The light sources in the present invention may be located and/or positioned behind or substantially behind the reflection hologram being illuminated (i.e., on the opposite side from which the image is viewed). This contrasts with the general prior art where the light source is located in front of the hologram. The present invention therefore relates to a reflection hologram with the light source or sources located and/or positioned either behind or in front of the holographic image being formed.

The light source or sources may be located and/or positioned within an enclosure or box. The light source or sources may therefore be substantially encapsulated within the holographic display apparatus thereby forming a self-contained apparatus. This is in contrast to prior art systems.

In alternative embodiments, the light source or sources may be positioned outside the enclosure using, for example, a close proximity mirror.

Typically, the formed hologram may be formed on an inner surface/side of the enclosure or box and may then be viewed from the outside. The display surface may therefore be substantially transparent.

The holographic display apparatus may also comprise optics which may be used to redirect or refocus the emitted light into a desired way for the formed hologram.

Illumination angles of incidence at the hologram surface from the illuminating array apparatus are high and are typically, for example, about 50-85 degrees or preferably 60-85 degrees and typically at least about 70 degrees.

According to a further aspect for the present invention there is provided a method of forming a holographic image using the holographic display apparatus as described in any of the previous aspects.

BRIEF DESCRIPTION OF THE FIGURES

Embodiments of the present invention will now be described, by way of example only, with reference to the accompanying drawings in which:

FIG. 1b is a front view representation of the light source and associated optics shown in FIG. 1a;

DETAILED DESCRIPTION

Generally speaking, an embodiment of the present invention resides in the provision of a compact illumination unit providing a reference optical beam intended for replaying a holographic image. A standard light source is replaced with an array of smaller light source units to perform the same function in a smaller package in close proximity to the hologram. The array achieves a similar source brightness as the standard illumination unit but in a much more compact form.

By providing a more compact illumination unit provides the technical advantage of the array allowing the creation of a low-profile optic that industrial designers can then use to minimise the size of their holographic/illumination systems. The present inventors are the first to appreciate such technical advantages which are discussed and exemplified below.

Figure 1A:
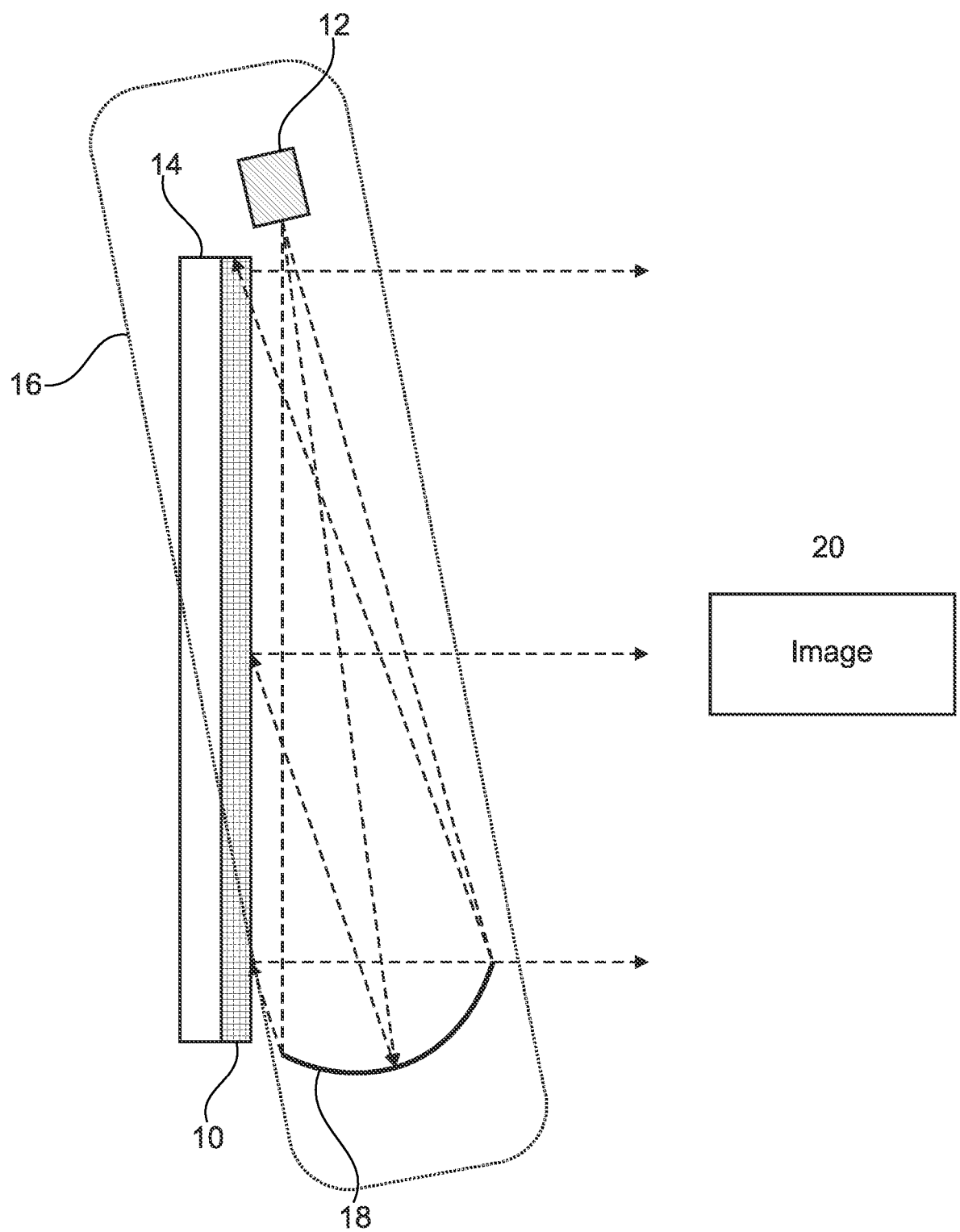
FIG. 1a is a representation of a side view of a light source and associated optics according to the prior art.

FIG. 1a is a side view representation of a prior art conventional illumination of a reflection hologram 10. There is shown a light source 12 (e.g. a laser or LED), a substrate 14 (e.g. a glass substrate), a large illumination unit 16, a mirror or HOE 18 and an image 20.

Figure 1B:
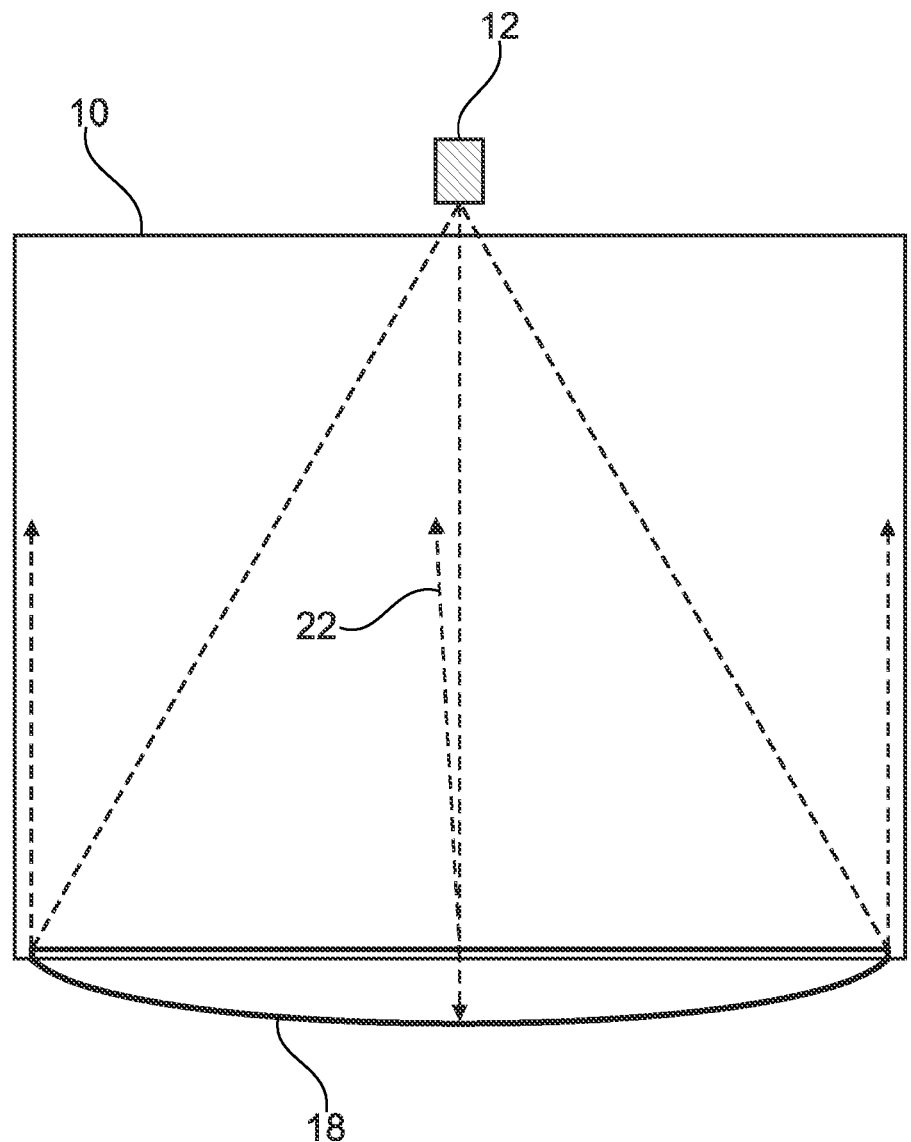

FIG. 1b is a front view of the representation shown in FIG. 1a which shows a collimated illumination 22.

The disadvantage of the illumination apparatus shown in FIGS. 1a and 1b is the large illumination unit 16 used.

Figure 2:
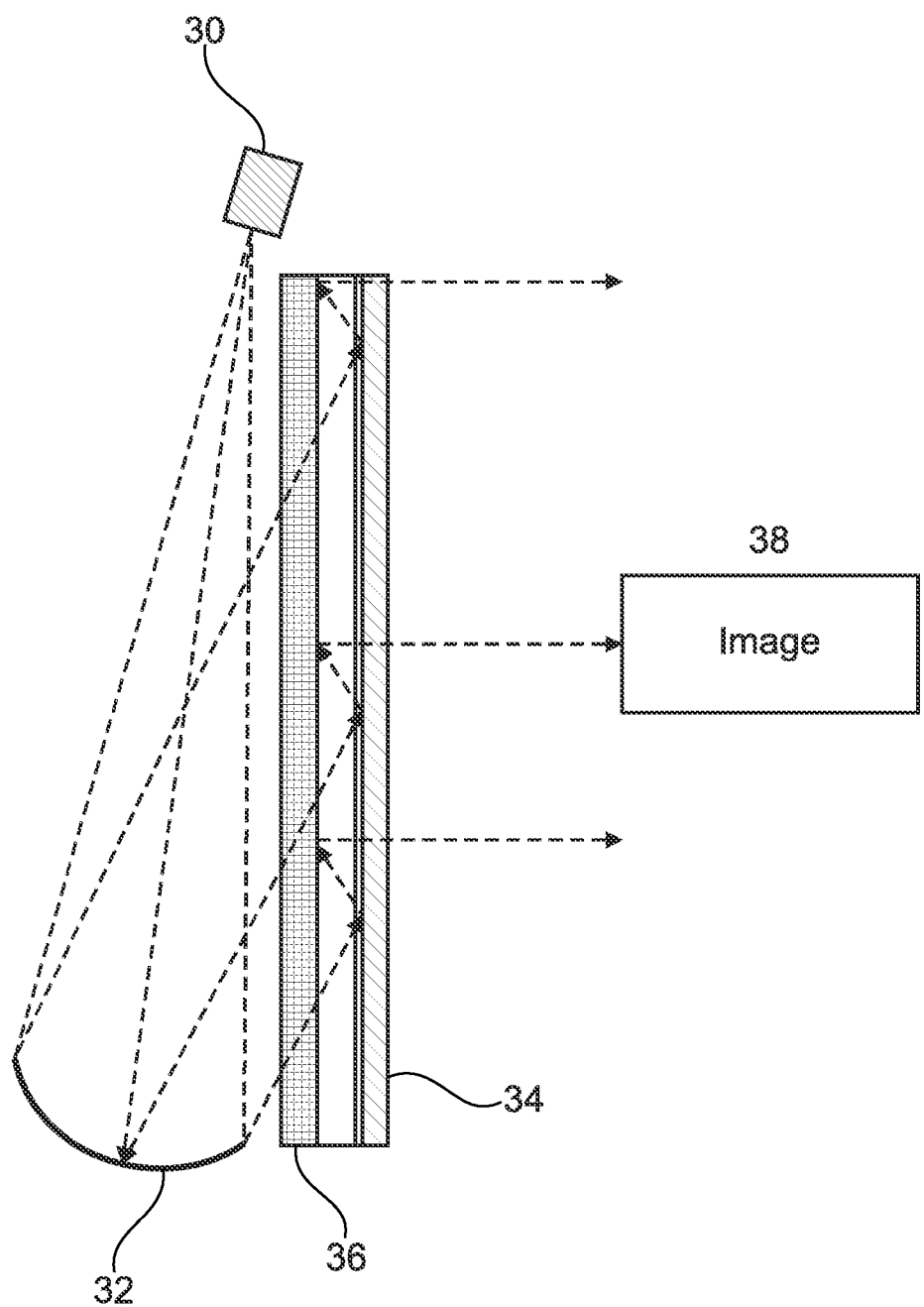
FIG. 2 is a representation of a prior art illumination of a reflection hologram as described in U.S. Ser. No. 14/253, 733.

FIG. 2 is a representation of a prior art illumination of a reflection hologram as described in U.S. Ser. No. 14/253, 733. In FIG. 2, there is shown a light source 30 (e.g. a laser or LED), a concave mirror or HOE (32), an HOE or angle selective mirror 34, a hologram 36 and an image 38.

In FIG. 2 the light source 30 is positioned in a configuration typical for a transmission hologram. However, there is the addition of a HOE 34 to reflect the illumination so that the light now matches the original reference beam of the reflection image hologram. This configuration has several advantages as detailed in the patent application U.S. Ser. No. 14/253,733, which is an application by the previous inventors and is incorporated herein by reference. Such an arrangement has some advantages such as, for example, being less susceptible to ambient lighting that can degrade the contrast of the image 38.

The diagrams shown in FIGS. 1a, 1b and FIG. 2 show a light source and associated optics used to illuminate a holographic plate, which in turn generates an image from the holographic plate. In both cases the size of the illumination module extends to at least the full size of the holographic plate with light sources and collimation optics positioned at the top and bottom of the holographic plate respectively. This has a number of disadvantages.

In contrast to the illumination techniques shown in FIGS. 1a, 1b and 2 an embodiment of the present invention relates to using collimated illumination derived from an array (i.e. a plurality) of light sources. This provides the specific technical advantages such as reducing the volume of the illumination unit when compared to U.S. Ser. No. 14/253, 733.

Conventional illumination using a large area LED chip and collimator has been found to create an intensity profile that drops significantly towards the edge of the hologram. The present invention addresses this problem. By utilizing a distributed array of smaller light sources, it has been found possible to create a more compact system with more uniform illumination of the hologram and hence improve the quality of the final holographic image.

The inventors of the present application have sought to find an ideal light source for illumination of a holographic image plate and have found that a desired light source may preferentially have at least one or more of the following characteristics:

The wavelength of the light source should match or match as closely as possible that of the holographic recording laser;

The spectral bandwidth of the light source should be smaller or approximately matched to that of the hologram; and The beam from the light source should preferably be configured to match the reference beam geometry used to record the hologram and have excellent beam quality (collimation or etendue) to produce high resolution reconstructed holographic images.

In the below, we will describe a compact light source, suitable for illuminating a holographic plate according to embodiments of the present invention.

Figure 3A:
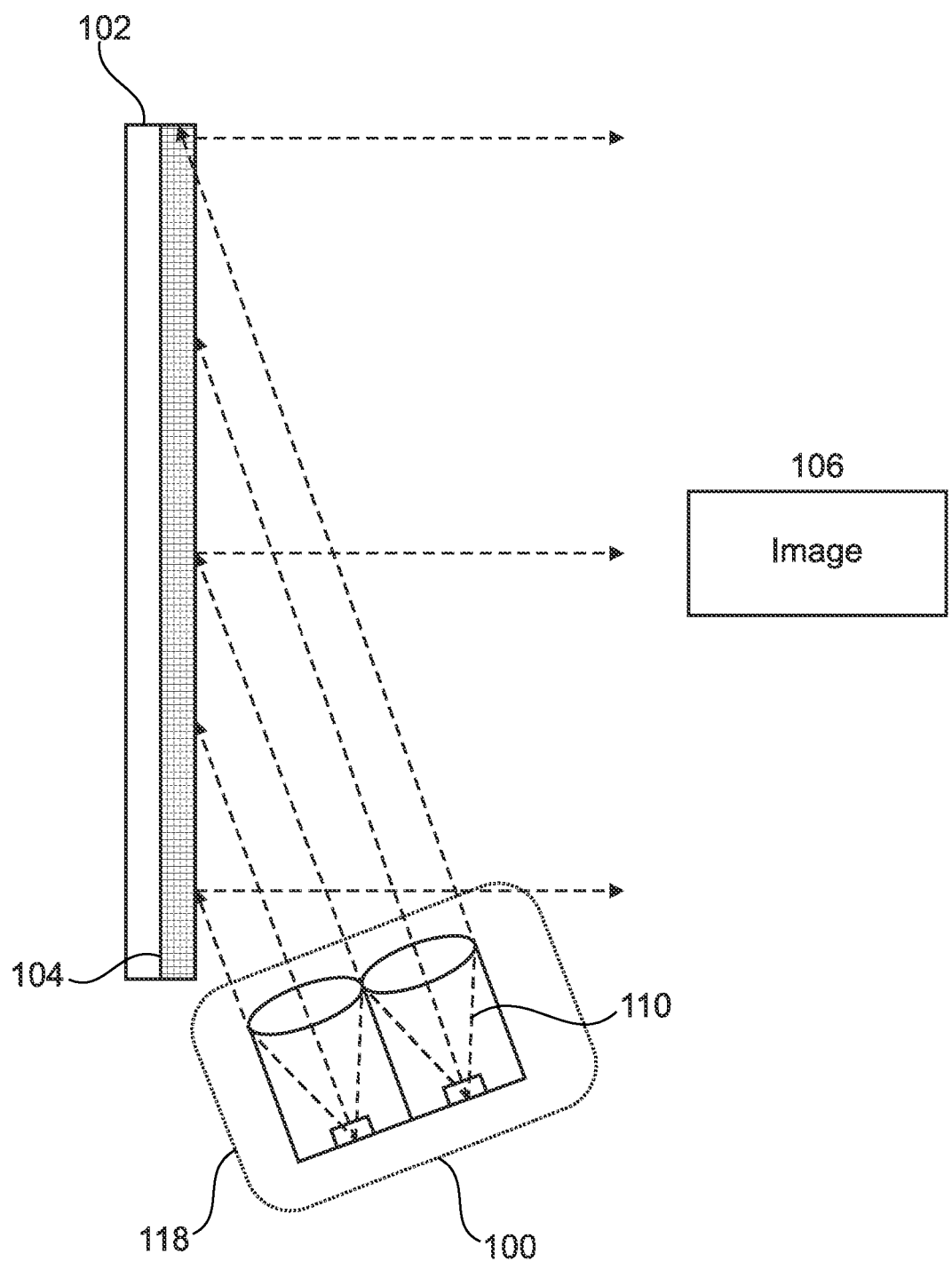
FIGS. 3a and 3b are side and front view representations of an array of small optical units arranged at the bottom of a hologram and forming a large area collimated reference beam according to an embodiment of the present invention.
Figure 3B:
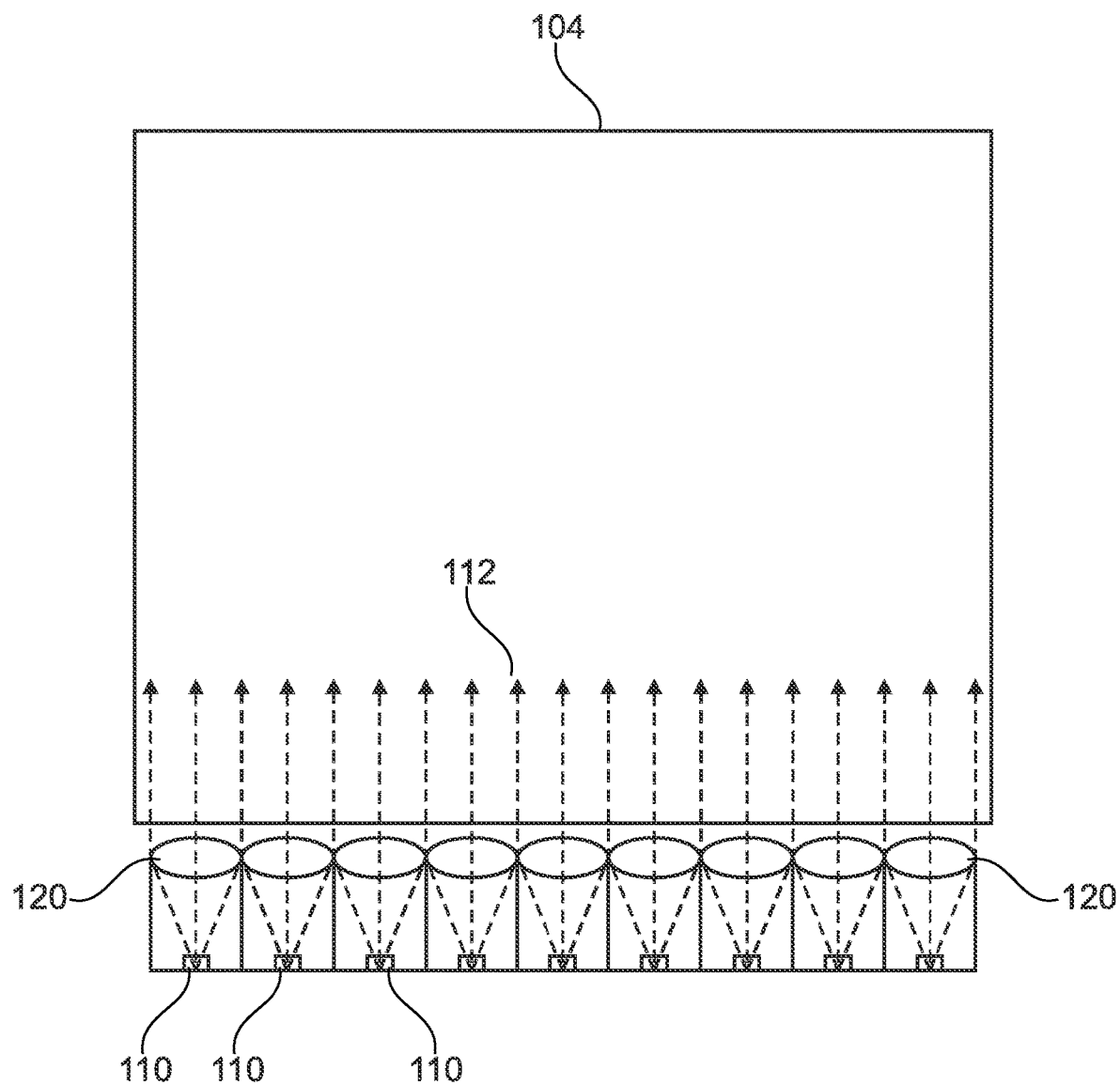

FIGS. 3a and 3b are representations of an array of small optical sub-units arranged at the bottom of a hologram and forming a large area collimated reference beam according to an embodiment of the present invention. Each sub-unit comprises a light source and a collimating optic. FIG. 3a is a side view and FIG. 3b is a front view which show the creation of a collimated light source for a reflection hologram.

In particular, FIG. 3a shows an illumination unit 100 in the form of a compact collimated illumination unit that comprises an array of light sources i.e. at least two or more or a plurality of light sources. The dimensions of the compact sub-unit 110 might typically be in the 5-50 mm range, but is not restricted to this range. Typically, close packing of the sub-units in the array is used for maximum optical efficiency.

The compact collimated illumination unit 100 may comprise a plurality or an array of light sources formed from lasers and/or LEDs. FIG. 3a also shows a substrate 102 (e.g. a glass substrate), onto which hologram 104 is mounted if it made of film, and an image 106. Light from the compact light source 110 is reflected from the substrate 102 to form the hologram 104 and image 106.

FIG. 3b shows that there may be an array of sub-units 110 to form collimated illumination for hologram 104. Light from the sub-units 110 is shown being emitted in collimated illumination 112.

FIGS. 3a and 3b therefore illustrate the present invention and show that there is an array of optical units 110 located at the bottom/underside of the hologram 104 and substrate 102. Light is emitted from the array of light sources 100 onto the substrate 102 to form the hologram 104 and image 106.

The illumination unit 100 may operate in a wavelength of covering the visible spectrum from about 400 nm to 640 nm. The sub-units 110 have the function of forming a large area beam 112.

By referring to FIG. 3a and the outline box 118 for the compact collimated illumination unit 100 it can be seen that this is of reduced size compared to that shown in conventional systems as shown in FIGS. 1a and 1b.

FIG. 3b shows that above each of the light sources 110 there is an optical element 120 used to form the collimated illumination 112. The optical element 120 is in the form of a convex lens in this embodiment.

The optical sub-units 110 are each capable of collimating light from a source such as an LED or laser. The collimation may be achieved with a lens but could also be achieved with a reflector. The degree of collimation (or beam quality) is equivalent to or better than that achieved with the single source/large collimating optic shown in FIGS. 1a and 1b.

The optical illumination unit 100 and associated sub-units 110 forming a light array can also be arranged to form an overall diverging or converging beam to represent the reference beam used in the recording of an original hologram. This can be done by arranging the offset of the light sources within the units such that the output angle varies gradually from sub-unit to sub-unit.

Close packing of the light sub-units 110 can be achieved using lens elements formed into rectangular, hexagonal or some other suitable tessellating shape.

Figure 4:
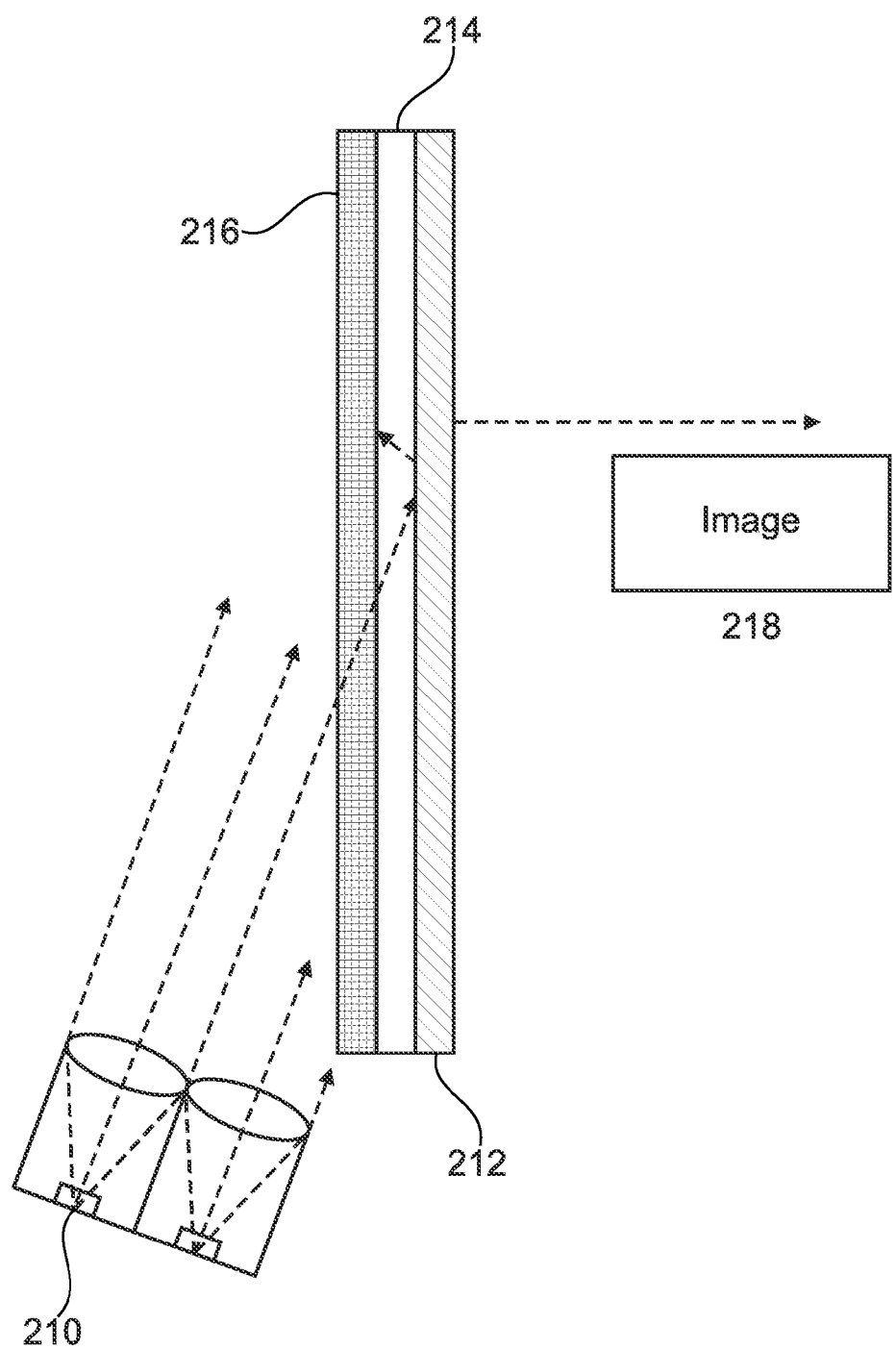
FIG. 4 is a representation of a collimated light source for a reflection hologram and including a HOE according to a further embodiment of the present invention.

FIG. 4 is a representation of a collimated light source for a reflection hologram and including a HOE according to a further embodiment of the present invention. In FIG. 4 there is a compact collimated illumination unit 210 which comprises an array of lasers and/or LEDs as previously described FIGS. 3a and 3b. In this embodiment, there is a separate reflecting HOE or angle selective mirror 212, as described in the U.S. Ser. No. 14/253,733. There is also a substrate 214 (e.g. a glass substrate), a hologram 216 and a formed illuminated image 218.

The collimated light formed in FIG. 4 is therefore formed using a similar compact collimated illumination unit as described in FIGS. 3a and 3b. Such an apparatus therefore has the same corresponding technical advantages as previously described such as reduced size and equivalent degree of collimation (or beam quality) than that achieved from a single light source or large collimating optic as found in the prior art such as shown in FIGS. 1a and 1b.

Figure 5A:
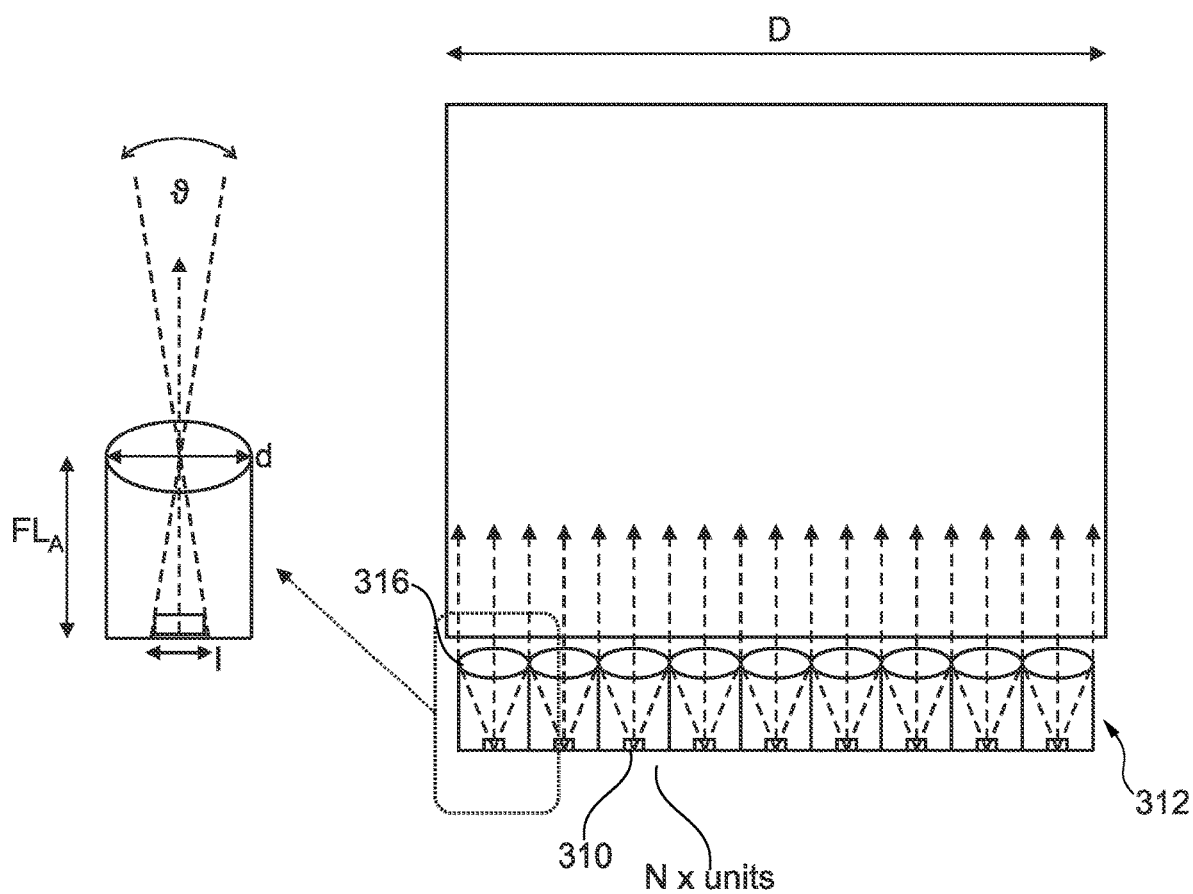
FIGS. 5a and 5b are representations of light sources used in single optic and collimated illumination array units according to a further embodiment of the present invention.
Figure 5B:
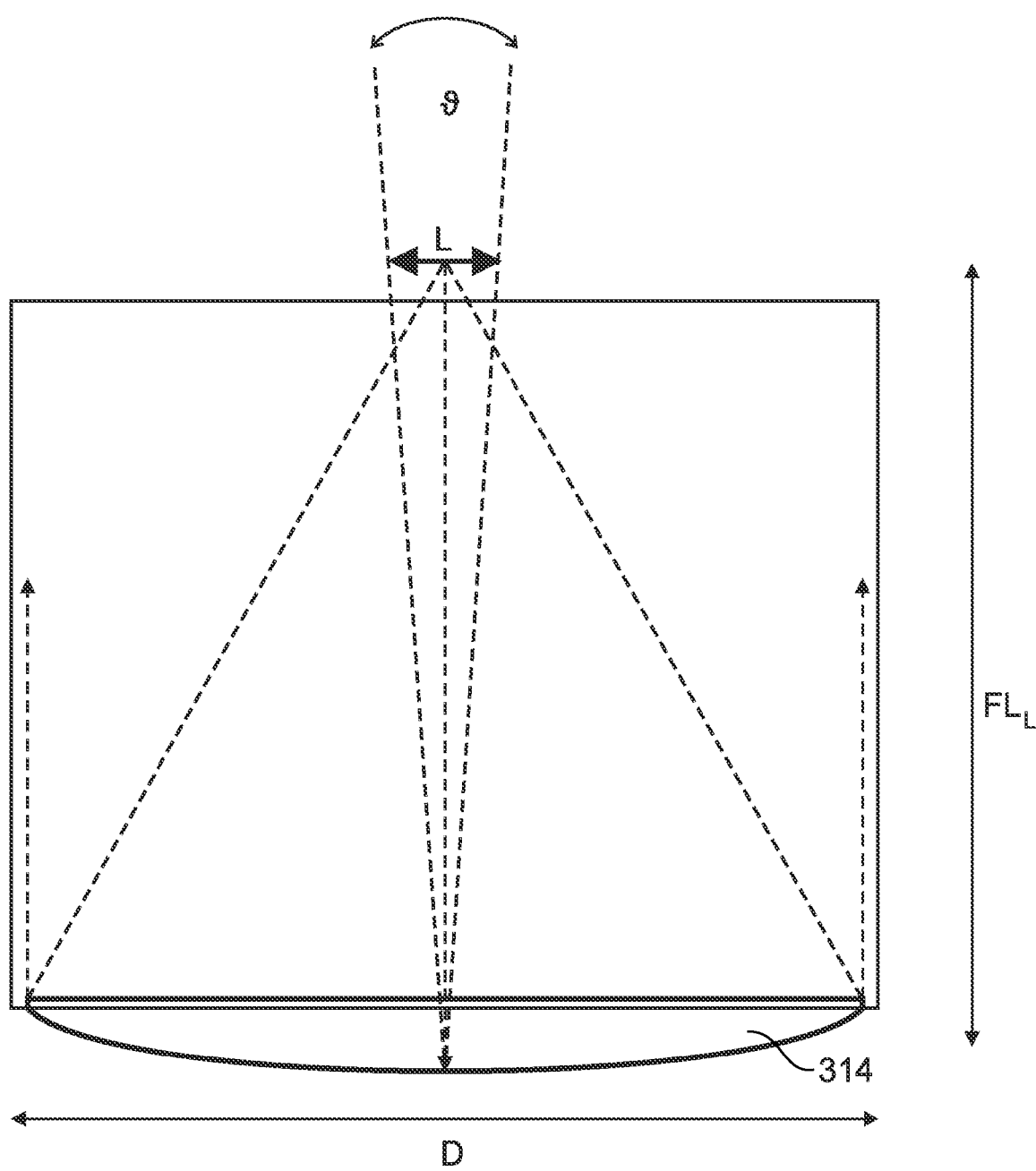

FIGS. 5a and 5b are representations of illumination systems based upon array optics and a single optic to produce collimated beams for reference beam illumination of holograms. In particular, FIG. 5a shows an array of light sources 310 (i.e. N×sub-units) such as an array of lasers and/or LEDs to form a collimated illumination unit 312. In contrast to FIG. 5a, in FIG. 5b there is a single collimator 314.

In FIG. 5a, there is a plurality (i.e. an array) of light sources 310. Above the light sources 310 there is a series of optical elements 316 which are used to form the collimated light.

The Figures help to explain how the array-based approach can achieve a collimated beam of equivalent beam quality to the conventional single optic system. With reference to FIG. 5b and equation 1, the quality of the collimated beam is defined as the product of the beam width (D) and the sine of the divergence angle of the beam (q), hence beam quality is D×sin(q). Referring to FIG. 5a, an individual optical sub unit of the array has a beam quality of d×sin(q) where d is the width of the sub unit. Since the total width of the array comprises (N) units (d) wide then (N×d=D), producing a beam quality of the array equivalent to the single optic case of D×sin(q). By choosing the size of the LED chip (I) used in the sub-unit optic and the focal length of the optic ($FL_A$) it has been found that it is possible to match the collimation angle (q) achieved by the conventional illuminator which uses a larger LED chip size (L) and collimator focal length ($FL_L$). The equivalence in collimation angle (q) is achieved by ensuring that the ratio of the chip size to optical focal length are the same in both cases, i.e. $[(I/FL_A)=(L/FL_L)]$ Equation 1

BEAM QUALITY = [DIMENSION] × [SIN(ANGLE)](mm.mrad)

$$(\text{Pseudo-array}) = [Nxd] \times [\sin(\vartheta)] \text{ where } \tan(\vartheta) \sim l/FL_A$$
$$= [D] \times [\sin(\vartheta)]$$

$$(\text{Single Collimator}) = [D] \times [\sin(\vartheta)] \text{ where } \tan(\vartheta) \sim L/FL_L$$
$$= [D] \times [\sin(\vartheta)]$$

This therefore shows that using an array of light sources as proposed by the present invention provides an equivalent collimated beam to that of a single optic system as defined by the beam quality definition above.

The present inventors have also found that it is possible to ensure that the total luminous flux collected by the array is equivalent or higher to that of a large LED chip conventional single source option. Hence coupled with the degree of collimation, the effective brightness of the array can match or better that of the single LED/optic. This is explained by the detailed description of FIGS. 10a and 10b below.

The design of the optical array in the present invention may include the following:

a single integrated multi-optic lens/optic that can be replicated by techniques such as injection moulding;

stray light between individual light units being controlled by optical baffling; and minimising of any "grid" pattern in the intensity distribution.

Ideally there will not be any need to actively align the components in the lens array. Hence tolerancing of the LED chip placement on a single PCB and manufacturing of the lens array may be done to allow the components to snap into place.

Figure 6:
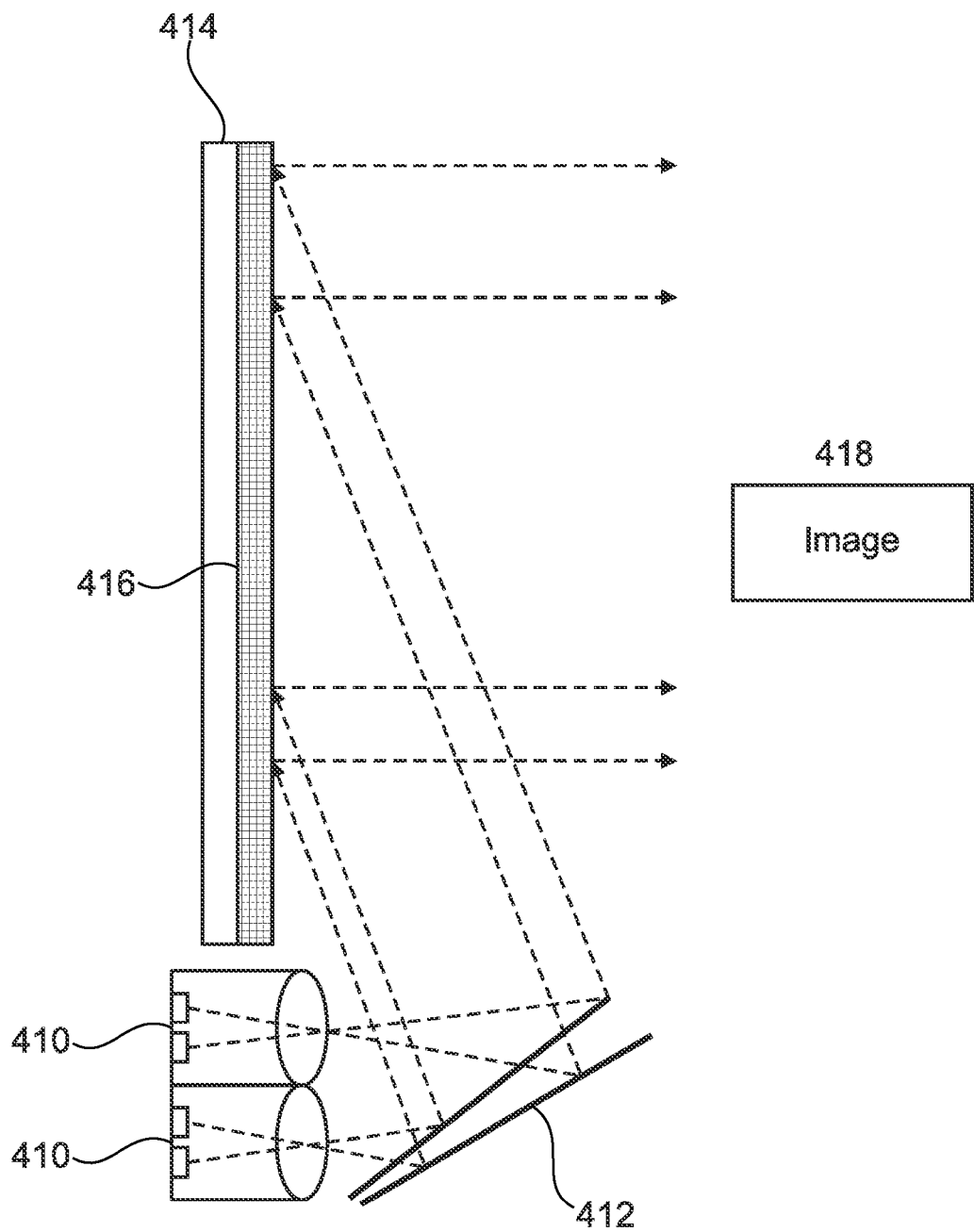
FIG. 6 is a representation of a multi-colour illumination using a collimation array according to a further embodiment of the present invention.

FIG. 6 is a representation of a multi-colour illumination using a collimation array according to a further embodiment of the present invention. In particular, FIG. 6 shows one configuration to achieve multiple wavelength illumination using separate coloured LEDs. Dichroic mirrors (or HOE mirrors) are used to ensure that the multi-wavelengths are collinear.

In the diagram of FIG. 6, there is an array of sub-units 410 where the light is controlled and exits onto dichroic mirrors or HOEs 412. The mirrors 412 are arranged at different angles so that the light of different colours are brought to be collinear. The light is then reflected onto the hologram 416, and then reflected by the hologram 416 to form an image 418.

Figure 7A:
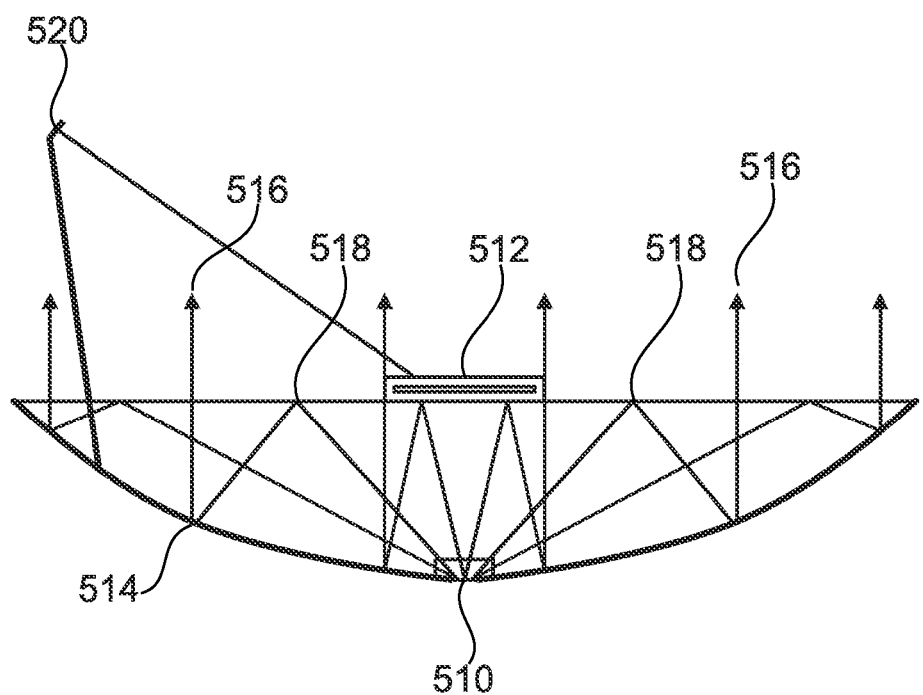
FIGS. 7a and 7b are representations of a low-profile collimated beam using an array of catadioptric elements according to a further embodiment of the present invention.
Figure 7B:
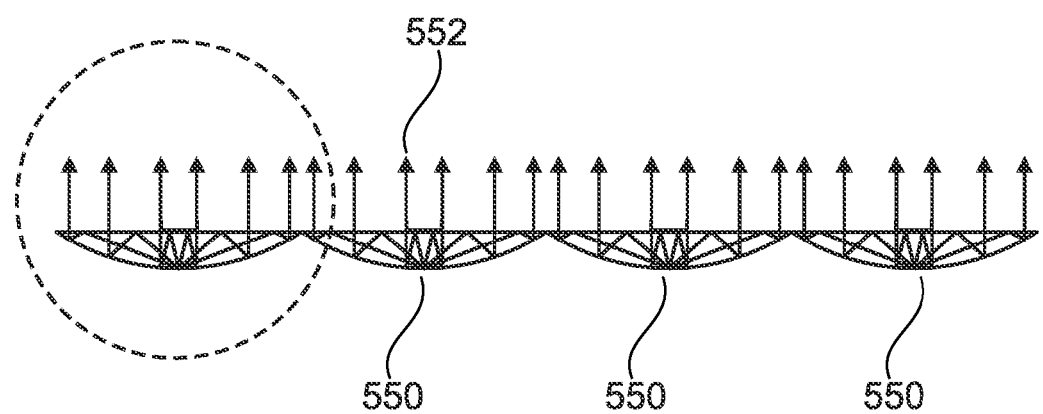

FIGS. 7a and 7b are representations of a low-profile collimated beam using an array of catadioptric elements according to a further embodiment of the present invention. In particular, FIG. 7a shows a light source 510 in the form of an LED or laser. Located above the light source 510 there is a mirror coating 512 in the form of a flat mirror which reflects light back down towards a concave surface 514 which has a mirror coating 520. As shown in FIG. 7a, a collimated beam of light 516 is formed using a combination of refractive and reflective optics, more generally referred to as catadioptric optics (http://www.luxeonstar.com/assets/downloads/carclo-guide.pdf).

As shown in FIG. 7a there is total internal reflection (TIR) occurring at, for example, area 518.

FIG. 7b shows an embodiment where there is an array of catadioptric optics 550 to form a collimated beam of light 552. The collimated beam of light may be used in holographic applications as discussed above.

Figure 8A:
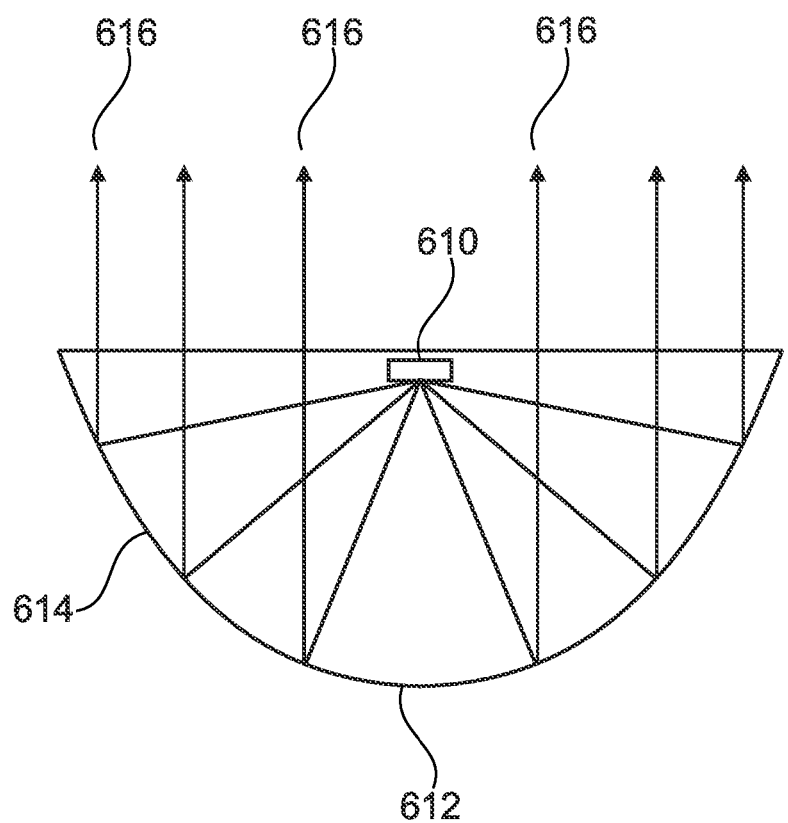
FIGS. 8a and 8b are representations of a collimating element in the form of a parabolic mirror or generic reflector profile used to form a collimated beam according to a further embodiment of the present invention.
Figure 8B:
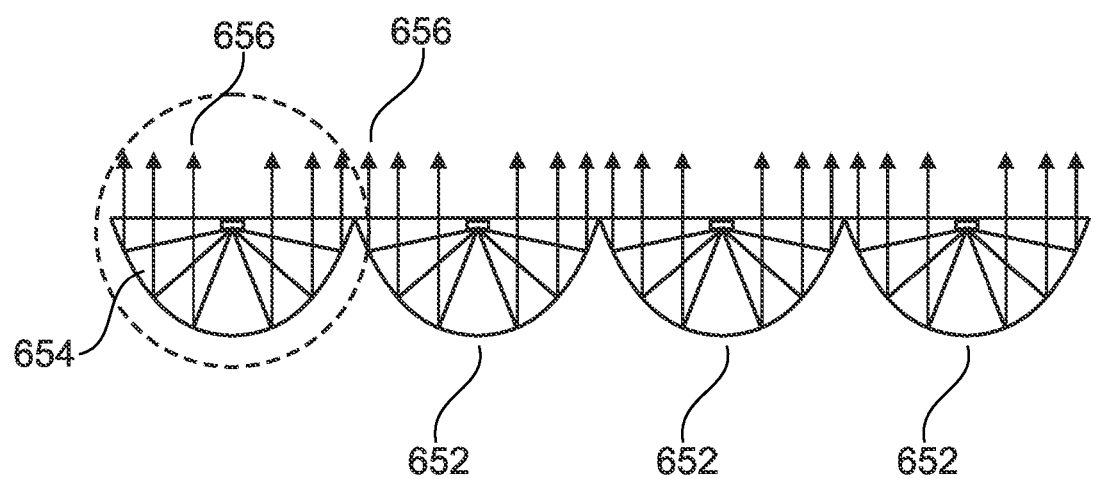

FIGS. 8a and 8b are representations of a collimating element in the form of a parabolic mirror or generic reflector profile to form a collimated beam according to a further embodiment of the present invention. FIG. 8a shows a light source 610 (e.g. an LED or laser) emitting light onto a parabolic mirror 612 comprising a mirror coating 614. As shown in FIG. 8a, this forms a collimated light beam 616. The light beam 616 may be used in holographic applications as described above.

FIG. 8b shows an array of parabolic mirrors 650 with each parabolic mirror 650 having a light source 610 (e.g. an LED or laser) located at its focal centre. Similar to FIG. 8a, each parabolic mirror 652 comprises a mirror coating 654 and forms a collimated light beam 656 that can be used in holographic applications.

Figure 9:
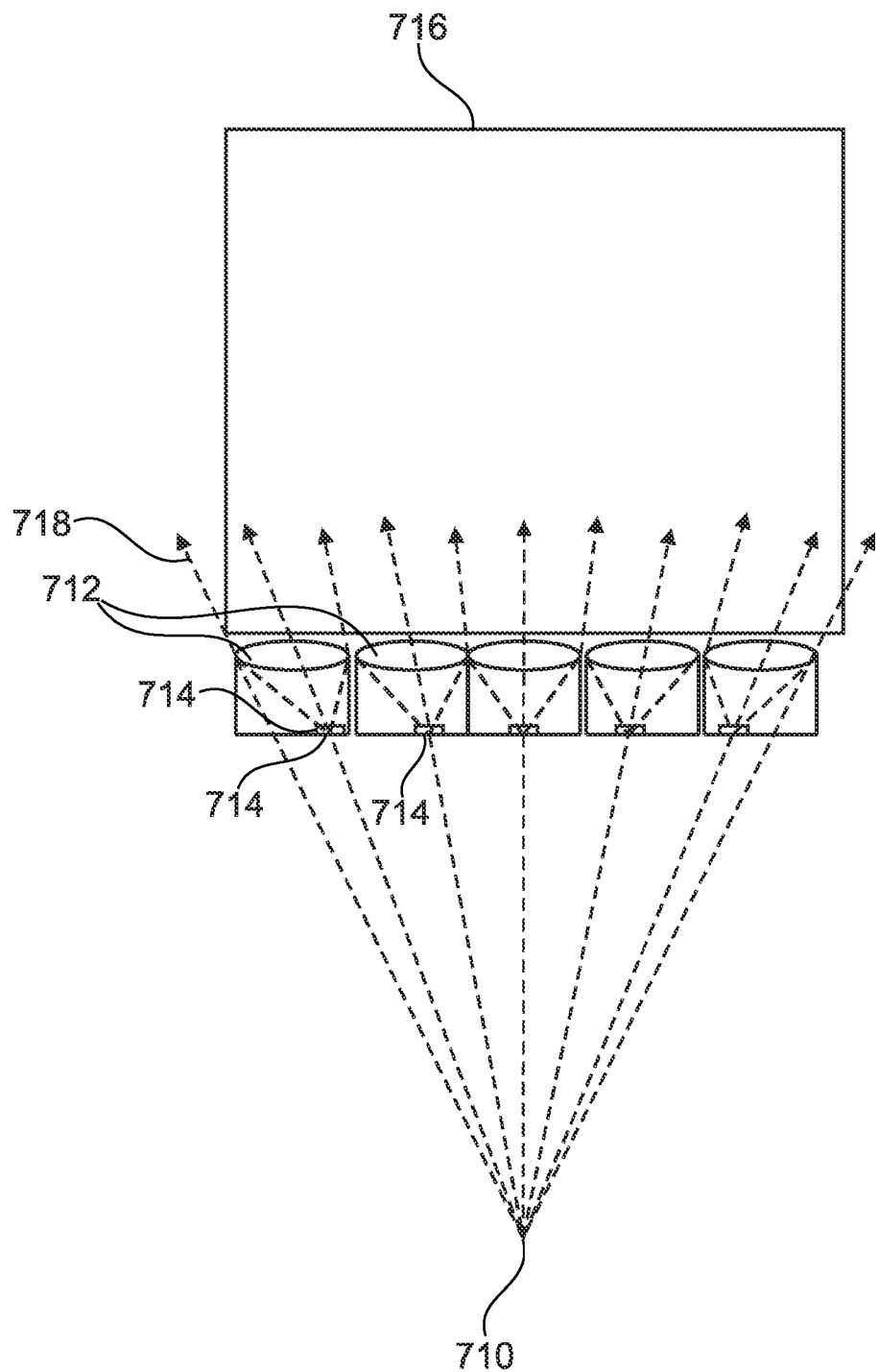
FIG. 9 is a representation of an array of optics to create a beam diverging from a virtual point source according to a further embodiment of the present invention.

FIG. 9 as a representation of an array of optics to create a beam diverging from a virtual point source according to a further embodiment of the present invention. In FIG. 9, there is shown a virtual point source 710. As shown in FIG. 9, there is an array of optics 712 which each comprise an offset light source 714 (e.g. an LED) to create a beam diverging from the virtual point source 710. There is a formed hologram 716.

In embodiments as shown in FIG. 9, in some instances, the reference beam to illuminate the hologram may not require a collimated beam, but rather a diverging or converging beam. An optic array of elements 714 can be configured to create a beam 718 that appears to be diverging from a virtual source point 710.

The position of each light source 714 (e.g. LED) is shifted off centre with respect to its local optic axis. The example shown in FIG. 9 uses an array of refractive optical elements 712, although similar beam shapes can be achieved with the other types of optical elements discussed in the present application.

Figure 10A:
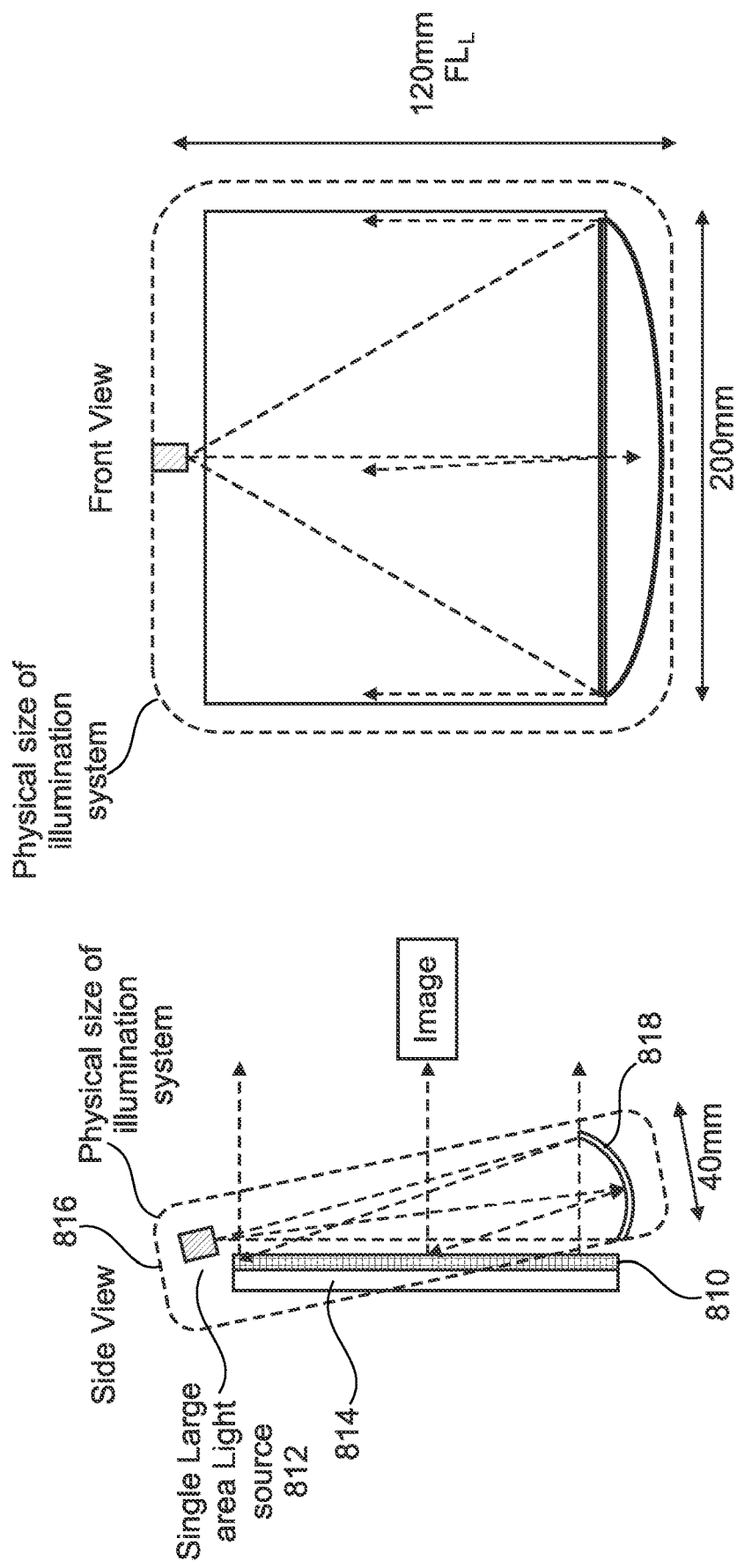
FIGS. 10a and 10b are representations of a conventional large illumination system according to the prior art and a compact version utilising array optics according to a further embodiment of the present invention, respectively.
Figure 10B:
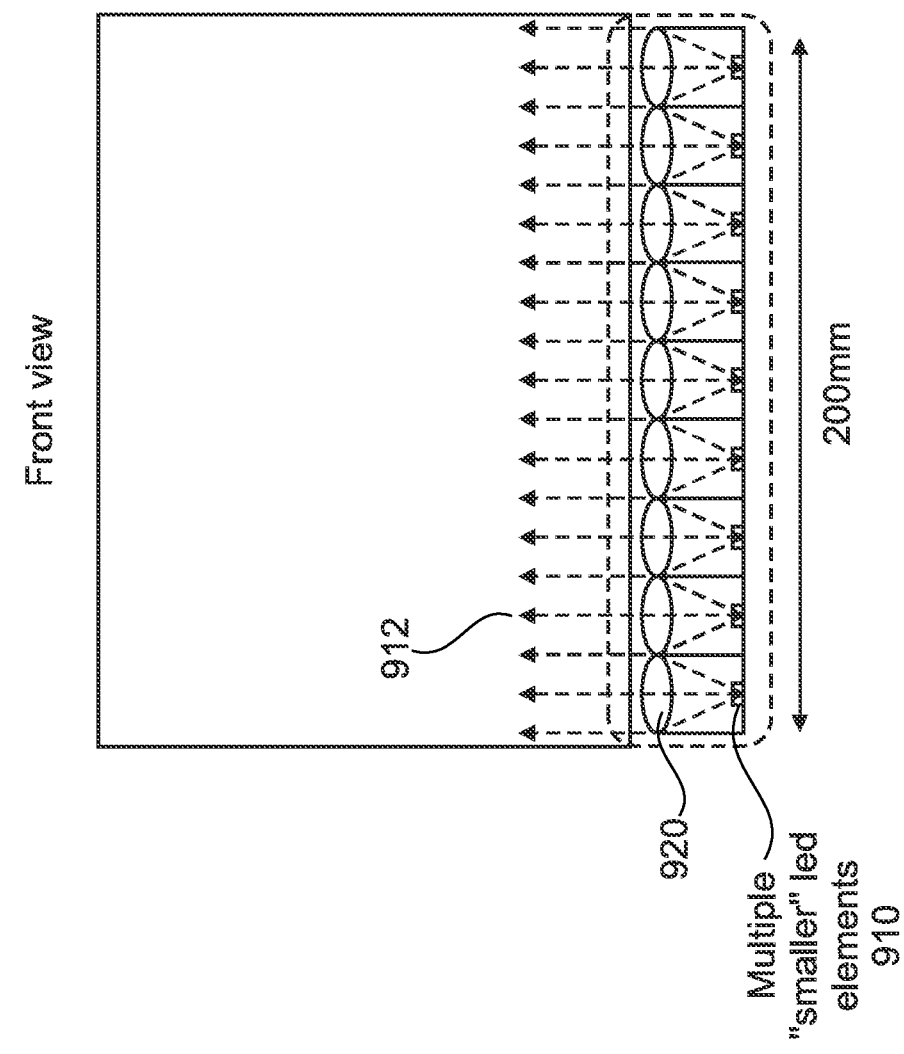
Figure 10B:
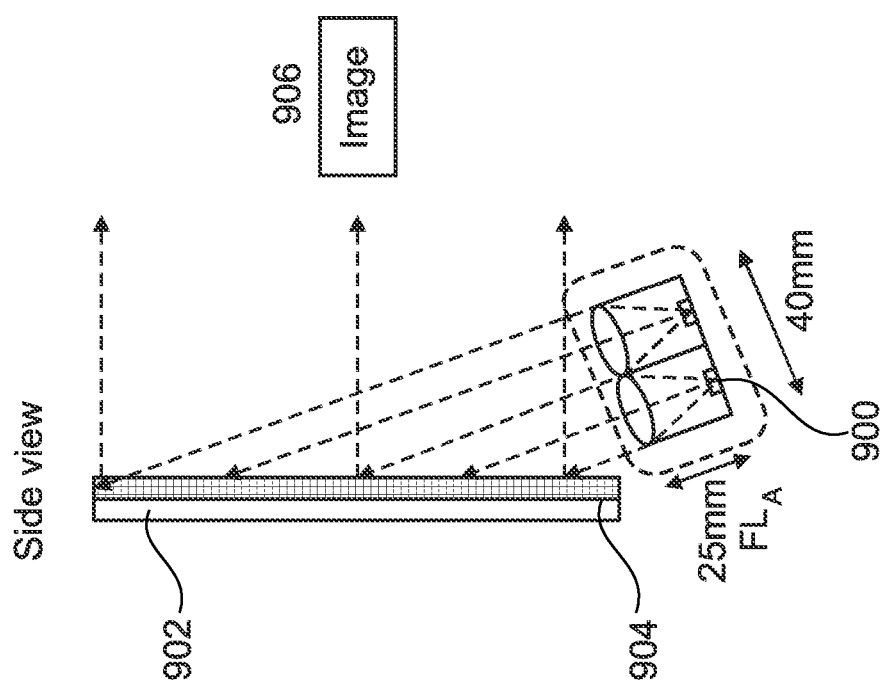

FIG. 10a details an example of a conventional collimated illumination unit according to the prior art. FIG. 10b details the equivalent illumination system based upon an array of optics with reduced volume according to the present invention.

In FIG. 10a there is a representation of a prior art conventional illumination of a reflection hologram 810. On the left-hand side there is a side view and on the right-hand side there is a front view of the conventional collimated illumination unit. There is shown a single large area light source 812 (e.g. a laser or LED), a substrate 814 (e.g. a glass substrate), a large illumination unit 816, a mirror or HOE 818 and an image 820.

In FIG. 10b on the left-hand side there is a side view and on the right-hand side a front view. By referring to FIG. 10b and the outline box 918 for the compact collimated illumination unit 900 it can be seen that this is of reduced size compared to that shown in conventional systems as shown in FIGS. 1a and 1b.

On the right-hand side of FIG. 10b it is shown that above each of the light sources 910 there is an optical element 920 used to form the collimated illumination 912. The optical element 920 is in the form of a convex lens in this embodiment.

By referring to FIG. 10b, the following details explain how an optic array can be more compact and produce a higher brightness beam compared to a single optic illuminator. The size of the hologram detailed here is 200 mm wide by 120 mm high and is illuminated by the reference beam at an angle of incidence of 70 degrees. It will be understood that the volume of any illumination system will scale with the area of the hologram being illuminated.

In this example, the volume of the conventional illumination based, FIG. 10a, unit is approximately 200×120×40 mm while the compact array version, FIG. 10b, has a volume of approximately 200×25×40 mm almost $\frac{1}{5}^{th}$ the volume of the conventional system.

We can also compare the intensity of the two illumination systems shown in FIGS. 10a and 10b to show that an array-based approach can be designed to produce equivalent or higher optical intensities.

For comparison, we assume that both systems have a total LED emitting area of 10 mm² and wavelength of 635 nm; i.e. a single 10 mm² LED chip in the conventional system and the array equivalent (2 rows of 10) consists of 20 multiples of smaller 0.5 mm² area LED chips.

Hence, for example, it can be assumed that the total LED output flux from each configuration shown in FIGS. 10a and 10b is equivalent and equal to about 700 lumens. An equivalent collimation of 1.6 degrees spread in the final beam can be achieved by a single reflector of focal length $FL_L$ of 120 mm in the conventional system shown in FIG. 10a and also by the array approach shown in FIG. 10b if each individual optical lens element has a focal length $FL_A$ of about 25 mm.

Optical modelling of the two systems shows that about 11.4% of the total output LED flux is collected in the standard system shown in FIG. 10a and about 15% for the array based approach shown in FIG. 10b according to the present invention. This translates into a final illumination intensity of 35,000 nits for the standard system 10a and a higher 42,000 nits for the array based illuminator shown in FIG. 10b according to the present invention.

Figure 11A:
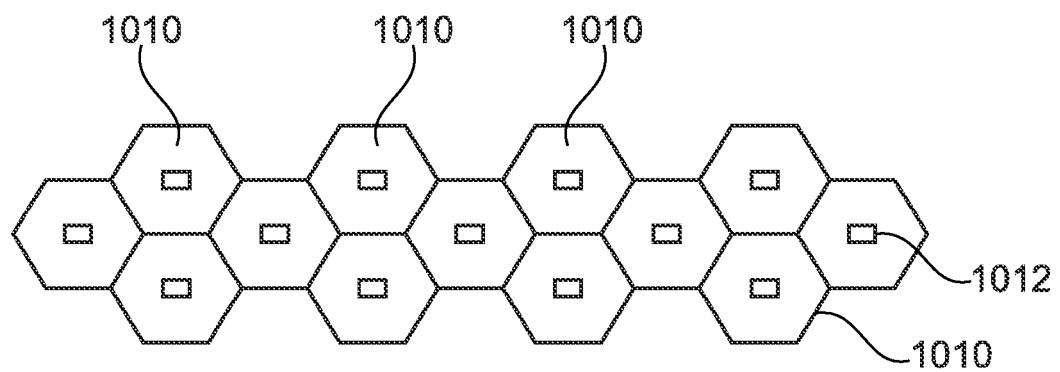
FIGS. 11a, 11b and 11c show arrays of optical elements close packed or tessellated together according to a further embodiment of the present invention.
Figure 11B:
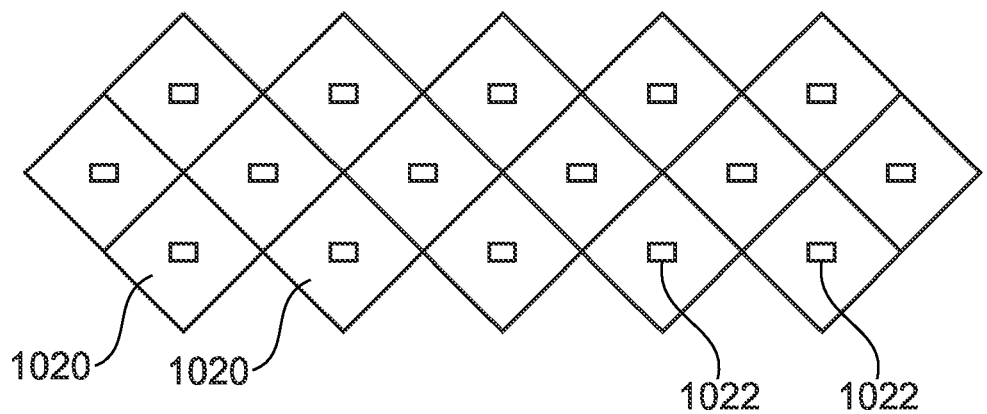
Figure 11C:
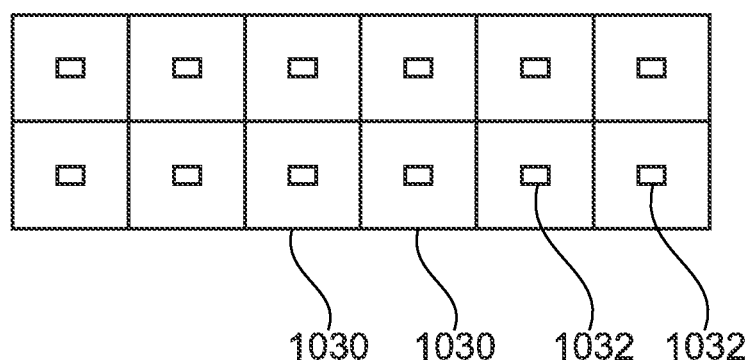

FIGS. 11a, 11b and 11c are examples of individual optical elements according to the present invention that are closely packed together, hexagonal, diamond and square shapes, respectively. The close packing of the shapes do not produce gaps between the optical elements. If gaps were present there would be dark banding in the intensity distribution of the illuminating beam which would degrade the quality of the holographic image.

In particular, FIG. 11a shows hexagonal optical elements 1010 which are close packed together with no gaps between the different optical elements 1010. In the centre of the hexagonal optical elements 1010 there are LED chips 1012.

FIG. 11b shows diamond-shaped optical elements 1020 which are close packed together with no gaps between the different optical elements 1020. In the centre of diamond-shaped optical elements 1020 there are LED chips 1022.

FIG. 11c shows square-shaped optical elements 1030 which are close packed together with no gaps between the different optical elements 1030. In the centre of the square-shaped optical elements 1030 there are LED chips 1032.

Figure 12A:
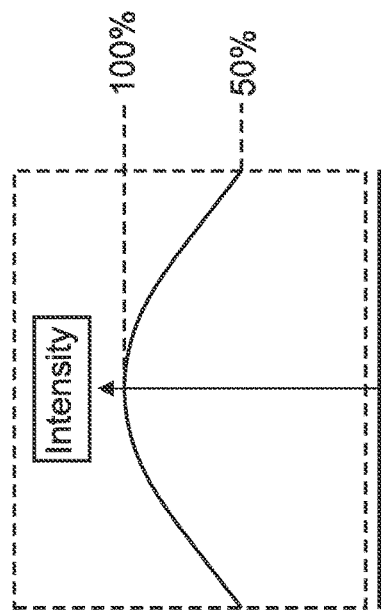
FIGS. 12a and 12b are representations of the intensity uniformity obtained using a conventional large illumination system and a compact version utilising array optics, respectively, according to a further embodiment of the present invention.
Figure 12A:
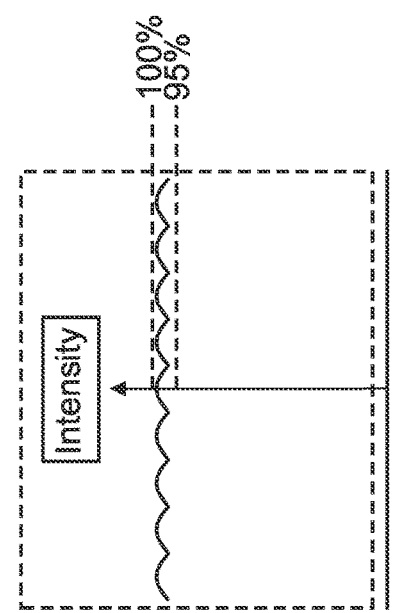
Figure 12A:
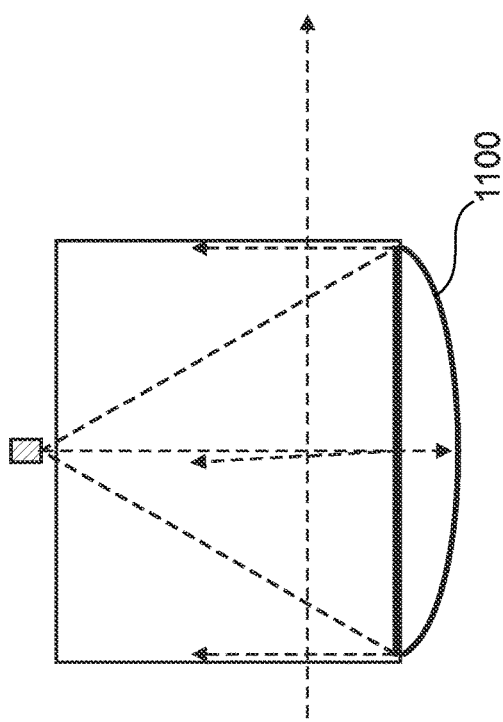

FIG. 12a is an example of the intensity uniformity across the reference illuminating beam for a single large optical system 1100 according to the prior art. The intensity at the edges of the display can drop to 50% or below the intensity at the centre of the beam. This is caused by the radiation pattern from the LED and vignetting of the beam by the optics.

Figure 12B:
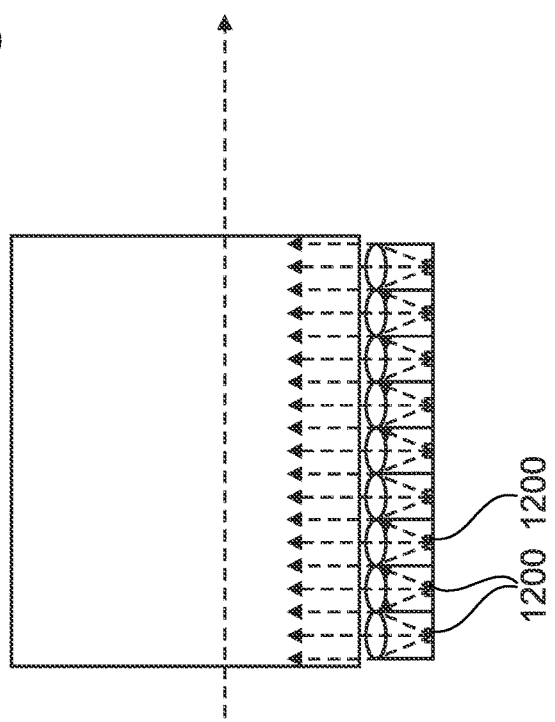

In contrast, FIG. 12b is composed of an array of illumination sub-units 1200 according to the present invention. The brightness of each illumination sub-unit 1200 may be adjusted by, for example, individually changing the drive current to each LED of the array. In this fashion it is possible to minimise the intensity drop at the edges of the beam to be less than 5% compared to the centre of the beam. The result of which is an improved holographic image when illuminated with a more uniformly intensity beam. This is a significant improvement over the prior art.

Whilst specific embodiments of the present invention have been described above, it will be appreciated that departures from the described embodiments may still fall within the scope of the present invention. For example, any suitable type of light source or plurality of light sources may be sued to form the holographic image. Moreover, any suitable type of reflecting surfaces (e.g. mirrors) may be used.

The invention claimed is:

1. A holographic display apparatus comprising:
an illumination unit capable of emitting light to illuminate a hologram and form a consequent holographic image,
wherein the illumination unit is comprised of an array of individual sub-units, each comprising a light source and corresponding optics, the illumination unit forming an overall collimated, diverging or converging beam, and
wherein the array of individual sub-units are arranged only at one edge of the hologram and provide an offset angle of illumination.

2. A holographic display apparatus according to claim 1, wherein the illumination unit is comprised of an array of smaller illumination sub-units, each comprising a light source and corresponding optics to control its overall output beam shape (e.g. collimated), and wherein the smaller sub-units are "close-packed", or tessellated, in an array such that there is no (or negligible) gap between them.

3. A holographic display apparatus according to claim 2, wherein the array of smaller illumination sub-unit is of a periodic structure including that of square, rectangular or hexagonal.

4. A holographic display apparatus according to claim 1, wherein the illumination unit forms a beam which is used as light source for either reflection or transmission holograms.

5. A holographic display apparatus according to claim 1, wherein the illumination unit is compact and comprises a plurality or an array of light sources formed from lasers and/or LEDs and a plurality or an array of optical elements.

6. A holographic display apparatus according to claim 1, wherein the array of light sources operate in a wavelength of about 400 nm to 700 nm.

7. A holographic display apparatus according to claim 1, wherein located close to the array of light sources there are optical elements (e.g. lenses) which are used to form collimated (or divergent or convergent) illumination and wherein the optical elements are in the form of a lens or a curved mirror.

8. A holographic display apparatus according to claim 1, wherein the collimated illumination unit is used for a reflection hologram and includes a separate reflecting HOE or angle selective mirror such that the reflection hologram is optionally illuminated from the rear, i.e. the opposite side from which the image is viewed.

9. A holographic display apparatus according to claim 1, wherein multi-colour illumination is formed wherein the individual light sources emit different colours of light such as from separate coloured LEDs; and wherein dichroic mirrors (or HOE mirrors) are used to ensure that the multi-wavelengths from each illumination sub-unit are collinear when reflected towards a hologram forming a consequent holographic image.

10. A holographic display apparatus according to claim 1, wherein the display apparatus comprises a low-profile collimated beam using an array of catadioptric elements and wherein the catadioptric elements comprise a convex reflective surface and located above the convex reflective surface there as a mirror which reflects light back down towards the convex reflective surface and wherein the catadioptric elements form a collimated beam of light using a combination of refractive and reflective optics.

11. A holographic display apparatus according to claim 1, wherein the display apparatus comprises an array of parabolic mirrors or generic reflector profile to form a collimated beam.

12. A holographic display apparatus according to claim 1, wherein the display apparatus comprises an array of optics to create an overall beam diverging from a virtual point source.

13. A holographic display apparatus according to claim 1, wherein there is an array of optics which each comprise an offset light source (e.g. an LED) to create an overall beam diverging from a virtual point source.

14. A holographic display apparatus according to claim 13, wherein the position of each light source (e.g. LED) is shifted off centre with respect to its local optic axis, such as to produce an overall beam propagating at an angle to the illumination unit.

\* \* \* \* \*